(12) United States Patent
Grier et al.

(10) Patent No.: US 7,772,543 B2
(45) Date of Patent: Aug. 10, 2010

(54) SYSTEM AND METHOD FOR PROCESSING NANOWIRES WITH HOLOGRAPHIC OPTICAL TWEEZERS

(75) Inventors: David G. Grier, New York, NY (US); Ritesh Agarwal, Philadelphia, PA (US); Guihua Yu, Cambridge, MA (US); Charles M. Lieber, Cambridge, MA (US); Kosta Ladavac, Ridgefield, CT (US); Yael Roichman, New York, NY (US)

(73) Assignees: New York University, New York, NY (US); Harvard University, Cambridge, MA (US)

( * ) Notice: Subject to any disclaimer, the term of this patent is extended or adjusted under 35 U.S.C. 154(b) by 150 days.

(21) Appl. No.: 11/329,579

(22) Filed: Jan. 11, 2006

(65) Prior Publication Data
US 2006/0240591 A1 Oct. 26, 2006

Related U.S. Application Data

(60) Provisional application No. 60/643,384, filed on Jan. 12, 2005.

(51) Int. Cl.
*G01N 21/63* (2006.01)
(52) U.S. Cl. .............................. 250/251; 438/99; 257/12
(58) Field of Classification Search .................. 250/251
See application file for complete search history.

(56) References Cited

U.S. PATENT DOCUMENTS

| 6,737,634 | B2 * | 5/2004 | Curtis et al. ............. 250/222.2 |
| 7,033,415 | B2 * | 4/2006 | Mirkin et al. ................. 75/345 |
| 7,241,988 | B2 * | 7/2007 | Gruber et al. ............... 250/251 |
| 7,411,181 | B2 * | 8/2008 | Plewa et al. ................. 250/251 |
| 2002/0175408 | A1 * | 11/2002 | Majumdar et al. .......... 257/734 |
| 2003/0032204 | A1 * | 2/2003 | Walt et al. .................... 436/518 |
| 2003/0132373 | A1 | 7/2003 | Curtis et al. |

(Continued)

FOREIGN PATENT DOCUMENTS

CN 1 519 199 8/2004

(Continued)

OTHER PUBLICATIONS

Plewa et al., "Processing Carbon Nanotubes with Holographic Optical Tweezers," Optics Express Opt. Soc. America USA, vol. 12, No. 9, May 3, 2004.

(Continued)

*Primary Examiner*—David A. Vanore
*Assistant Examiner*—Phillip A. Johnston
(74) *Attorney, Agent, or Firm*—Foley & Lardner LLP

(57) ABSTRACT

A system and method for manipulating and processing nanowires in solution with arrays of holographic optical traps. The system and method of the present invention is capable of creating hundreds of individually controlled optical traps with the ability to manipulate objects in three dimensions. Individual nanowires with cross-sections as small as 20 nm and lengths exceeding 20 μm are capable of being isolated, translated, rotated and deposited onto a substrate with holographic optical trap arrays under conditions where single traps have no discernible influence. Spatially localized photothermal and photochemical processes induced by the well-focused traps can also be used to melt localized domains on individual nanowires and to fuse nanowire junctions.

20 Claims, 1 Drawing Sheet

U.S. PATENT DOCUMENTS

2005/0221333 A1* 10/2005 Sundararajan et al. ......... 435/6

FOREIGN PATENT DOCUMENTS

| EP | 0 517 454 A2 | 12/1992 |
| --- | --- | --- |
| WO | WO 02/17362 | 2/2002 |

OTHER PUBLICATIONS

Ting Yu et al., "The Manipulation and Assembly of CuO Nanorods with Line Optical Tweezers," Nanotechnology, vol. 15, No. 12, Dec. 1, 2004.

Bonin et al., "Light Torque Nanocontrol, Nanomotors, and Nanorockers," Optics Express Opt. Soc. America USA, vol. 10, No. 19, Sep. 23, 2002.

* cited by examiner

SYSTEM AND METHOD FOR PROCESSING NANOWIRES WITH HOLOGRAPHIC OPTICAL TWEEZERS

This application is an application claiming the benefit under 35 USC 119(e) U.S. Application 60/643,384, filed Jan. 12, 2005, incorporated herein by reference in its entirety.

This work was supported by the National Science Foundation through Grant Numbers DMR-0233971 and DBI-0450878.

FIELD OF THE INVENTION

The present invention relates generally to processing nanowires, in particular semiconductor and metallic nanowires. More particularly, the present invention relates to the manipulating and processing of semiconductor and metallic nanowires in solution with arrays of holographic optical traps.

BACKGROUND OF THE INVENTION

Semiconductor and metallic nanowires are one-dimensional structures with unique electrical and optical properties that are used as building blocks in nanoscale devices. Their low dimensionality means that they exhibit quantum confinement effects. For this and other reasons, such nanowires are therefore versatile building blocks for assembling functional electronic and photonic devices. Realizing their potential requires efficient methods for assembling them into complex and specifically organized architectures.

SUMMARY OF THE INVENTION

It is therefore an object of the invention to provide an improved system and method for manipulating semiconductor and metallic nanowires.

It is another object of the present invention to provide an improved system and method for increasing the amount of force that can be exerted on semiconductor and metallic nanowires while minimizing radiative damage.

It is an additional embodiment of the present invention to provide an improved system and method for translating semiconductor and metallic nanowires.

In accordance with the above objects and others explained hereinafter, the present invention involves a system and method for using holographic optical tweezer arrays to assemble nanowires into precisely organized two and three-dimensional structures. Individual nanowires with cross-sections as small as 20 nm and lengths exceeding 20 µm are capable of being isolated, translated, rotated, manipulated in other ways and deposited onto a substrate with holographic optical trap arrays under conditions where single traps have no discernible influence. Spatially localized photothermal and photochemical processes induced by the well-focused traps can also be used to melt localized domains on individual nanowires and to fuse nanowire junctions.

These and other objects, advantages and features of the invention, together with the organization and manner of operation thereof, will become apparent from the following detailed description when taken in conjunction with the accompanying drawings, wherein like elements have like numerals throughout the several drawings described below.

DETAILED DESCRIPTION OF THE PREFERRED EMBODIMENTS

The present invention provides for a system and method for manipulating and processing nanowires, particularly semiconductor and metallic nanowires, in solution with arrays of holographic optical traps. In one embodiment of the present invention, CdS and Si nanowires are dispersed in water for implementation of the present invention. In this particular embodiment, the CdS nanowires have a nominal diameter of 80 nm and lengths up to 20 µm, while the Si nanowires have even more substantial aspect ratios, with diameters as small as 20 nm. These samples are charged into slit pores about 40 µm thick formed by sealing the edges of clean glass coverslips to the surfaces of microscope slides. Both materials are substantially more dense than water ($\rho_{CdS}=4.8$ g/cm$^3$, $\rho_{Si}=2.3$ g/cm$^3$) and rapidly sediment onto the lower glass wall, with the CdS samples lying essentially perfectly in the plane. In this embodiment of the invention, sealed samples are mounted for observation and manipulation on the stage of a Zeiss Axiovert S100-TV microscope outfitted with a 100×NA 1.4 S-Plan Apo oil-immersion objective. This lens is used both to create bright-field images of the dispersed nanowires and also to focus light from a continuous wave (CW) frequency doubled Nd:YVO$_4$ laser operating at 532 nm (Coherent Verdi) into optical traps.

A single beam of light brought to a tight focus forms an optical trap known as an optical tweezer that can capture a mesoscopic object in three dimensions. At laser powers below roughly 1 W, however, an individual optical tweezer appears to be incapable of moving either type of nanowires, such as semiconductor nanowires. Rapid heating at higher powers leads to the evolution of vapor bubbles whenever the focal point passes through a nanowire. Such rapid heating also leads to visible changes in the nanowires themselves, including bending, formation of nodules, and even scission. This is consistent with heating due to optical absorption in the substantial photon flux passing through the focal volume.

To exert more force on the nanowires while minimizing radiative damage, a large numbers of diffraction-limited optical traps are projected using the dynamic holographic optical tweezer technique. This approach uses a spatial light modulator (SLM) (Hamamatsu X7550 PAL-SLM) to imprint a computer-designed phase-only hologram encoding the desired array of traps onto the laser beam's wavefront before focusing. Each trap in the array can be translated independently in three dimensions by projecting a sequence of holograms encoding the sequence of intermediate trapping configurations.

Figure 1A:
FIG. 1(a) is an image showing a focused light beam from a linear sixty-trap array.
Figure 1B:
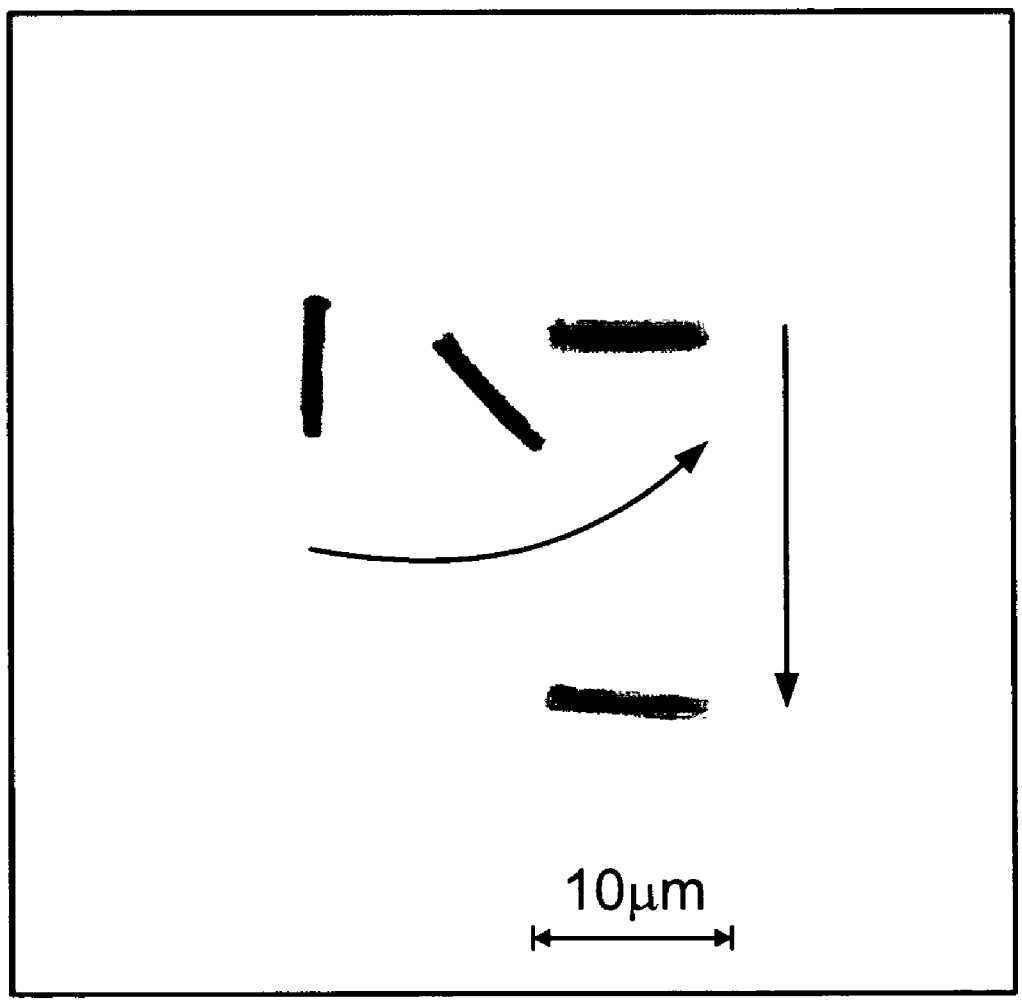
FIG. 1(b) is an image showing multiple exposures of a single CdS nanowire being rotated and translated by the optical trap array.

The image in FIG. 1(a) shows the focused light from a linear sixty-trap array, which is shown moving a CdS nanowire in FIG. 1(b). In this case, the array was focused into the plane of the nanowire to within 0.5 µm and powered by 3 mW per trap. The nanowire, which initially was oriented perpendicular to the optical trap array, rotates into registry within a few seconds, even at such a comparatively low laser power. Given the intertrap separation of 0.4 µm, roughly 15 traps are trained on this nanowire simultaneously in its final configuration.

Given the above conditions, once the nanowire is aligned with the array, it can be translated at speeds up to roughly u=10 µm/sec by moving the array across the field of view or by moving the sample stage relative to the array. It should be noted that the nanowire can be translated at speeds beyond u=10 μm/sec by increasing the power, optimizing the laser wavelength, or any of a variety of other mechanisms for increasing the effective force per trap. The drag on a cylinder of length L and radius a translating through an unbounded fluid of viscosity η at low Reynolds number is approximately $$F_\infty = 4\pi\eta(\epsilon + 0.193\epsilon^2 + 0.215\epsilon^3)Lu, \quad (1)$$

where $\epsilon = [\ln(L/A)]^{-1}$, which sets a lower limit on the optically applied force of 0.2 fN/trap for CdS nanowires of this cross-sectional area. The actual drag on this nanowire is substantially enhanced by the bounding glass surface at distance h≈0.5 μm from the nanowire's center, and is given to lowest order in a/h by $$F(h) = \frac{4\pi\eta Lu}{\ln\left(\frac{2h}{a}\right)}, \quad (2)$$

which increases the estimate for the trapping force by at least a factor of two.

The above estimates suggest that a single optical tweezer should be able to move a nanowire. Even if this were the case, however, the nanowire would rotate into an orientation that minimizes the drag force in the direction of motion, and thus would escape from the trap. The spatially extended trapping potential provided by the holographic optical tweezer array maintains the nanowire's orientation and thus makes controlled translation possible.

The conventional nature of the nanowires' response to optical tweezers is further demonstrated when an individual trap is transformed into an optical vortex, by imposing a helical phase profile $$\varphi(\vec{r}) = l\theta$$

onto the trapping laser's wavefront with the SLM. In this situation, $\vec{r} = (r,\theta)$ is a polar coordinate in a plane normal to the beam relative to the beam's axis and l is an integer winding number defining the wavefront's helicity. The effect of this modulation is to transform a point-like optical tweezer into a ring-like trap whose radius scales linearly with the winding number, and whose photons each carry an orbital angular momentum of $1\ell$, in addition to their intrinsic spin angular momentum. This angular momentum can be transferred to objects illuminated by the ring of light, resulting in a net torque proportional to the light's intensity.

Both Si and CdS nanowires tend to align themselves tangent to the ring of light. Once oriented tangentially, the cross-section that is subject to radiation pressure becomes larger and they get pushed away radially. Nevertheless, while in the region of the optical vortex trap, nanowires do get propelled around the circumference in the same direction as conventional micrometerscale dielectric spheres. These observations are consistent with the interpretation that nanowires experience optical tweezers as conventional optical gradient force traps despite their extremely small cross-sectional areas.

Optical tweezers also can move single nanowires vertically along the optical axis, and can press them against substrates. Unless particular care is taken to stabilize the nanowires against deposition, this results in the nanowire being irreversibly affixed to the substrate by van der Waals interaction. In cases where the nanowires are stabilized, for example by a layer of adsorbed polymer surfactant, they still can be fixed in place by selective photochemical or photothermal processes. The simplest of these involves increasing the laser power until the stabilizing layer is desorbed or destroyed. Such selective contact deposition can provide the basis for controlled assembly of nanowires onto prefabricated functional substrates. A more aggressive form of such optical processing can be used to selectively melt the contacts between nanowires, thereby fusing them into permanent structures. A more precise variant might use linear or nonlinear photochemical processes to selectively induce photochemical changes at nanowire junctions to create specific functionality.

Nanowires of the type described herein can also be modified by projecting light of a specified intensity or specified wavelength onto the nanowires. The respective intensity and wavelength are chosen to affect specific changes along the length of the nanowire. Changes that can be effectuated include, for example, melting of the nanowire, cutting of the nanowire, and chemical transformation. These changes can all occur at the junction between nanowires comprising similar or different materials. Such transformations can also result in the forming of mechanical, electrical, or optical contacts between nanowires, as well as between nanowires and other substrates.

The results presented here demonstrate that holographic optical tweezer arrays can be used to assemble semiconductor nanowires into precisely organized two and three-dimensional structures. This process can be optimized by tuning the laser wavelength to enhance the optical trapping force, and will become substantially faster and more highly parallel with advances in holographic trapping technology.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments and with various modifications as are suited to the particular use contemplated.

What is claimed is:

1. A method of manipulating nanowires disposed in a liquid, comprising the steps of:

providing a liquid;

providing a first nanowire selected from the group consisting of a semiconductor nanowire and metal nanowire;

positioning the first nanowire in the liquid;

providing an input beam of light;

imprinting a hologram on the beam of light to create a plurality of output optical traps arising solely from one of the input beams of light;

focusing the plurality of optical traps, which comprise more than two optical traps, and which arise solely from one of the input beams of light, along a line near the first nanowire forming an extended trapping potential in three dimensions to enable trapping the nanowire and maintaining orientation of the first nanowire in three dimensions during its translation in the fluid, thereby overcoming drag forces in the liquid; and manipulating a single one of the first nanowire in three dimensions using collectively the plurality of optical traps, which comprise more than two optical traps, and arise solely from one of the input beams of light, thereby minimizing radiative damage while exerting more force on the first nanowire.

2. The method of claim 1, wherein the plurality of optical traps are projected onto the first nanowire to enable the manipulation thereof and power in each of the optical traps is less than about 1W.

3. The method of claim 1, wherein the first nanowire comprises at least one of a metallic nanowire, a semiconductor nanowire, and an insulating nanowire.

4. The method of claim 2, wherein the array of optical traps comprise diffraction-limited optical traps.

5. The method of claim 2, further comprising the step of translating the first nanowire by altering the position of the array of optical traps relative to the first nanowire.

6. The method of claim 5, wherein the first nanowire is translated at a speed of up to about 10 μm per second.

7. The method of claim 5, wherein the first nanowire is translated at a speed greater than about 10 μm per second.

8. The method of claim 2, further comprising the step of translating the first nanowire by altering translating fluid supporting the at least first nanowire relative to the array of optical traps.

9. The method of claim 2, further comprising the steps of:
providing a second nanowire; and
fusing the first nanowire to the second nanowire by increasing the power projected by at least one optical trap of the array of optical traps.

10. The method of claim 2, further comprising the steps of:
transforming at least one of the array of optical traps into one optical vortex; and
using the one optical vortex to rotate and radially translate the first nanowire.

11. The method of claim 1, wherein the first nanowire has a diameter of about 20 nm.

12. The method of claim 1, wherein the plurality of optical traps have at least one of a specified intensity and specified wavelength to result in at least a partial change of the first nanowire, the change being selected from the group consisting of a cutting, a melting, and a chemical transformation.

13. The method of claim 12, wherein the plurality of optical traps possess a predetermined wavelength in order to cause the at least partial change in the first nanowire.

14. The method of claim 13, wherein the plurality of optical traps possesses a predetermined intensity in order to cause the at least partial change in the first nanowire.

15. The method of claim 13, wherein the at least partial change in the first nanowire occurs at a junction between the first nanowire and a second nanowire.

16. The method of claim 15, wherein the first nanowire and the second nanowire are selected from the group of identical materials and different materials.

17. The method of claim 12, wherein the change forms a contact between at least two of the first nanowire and the second nanowire, the second nanowire and a non-nanowire substrate, and the first nanowire and the non-nanowire substrate, wherein the contact is selected from the group consisting of a mechanical contact, an electrical contact, and an optical contact.

18. A method of processing a nanowire disposed in a liquid, comprising the steps of:
providing a liquid;
providing a first nanowire in the liquid, the nanowire selected from the group consisting of a metal nanowire and a semiconductor nanowire;
providing a beam of light;
imprinting a hologram onto the beam of light to create a plurality of beams of light;
forming a plurality of optical traps from the plurality of beams of light with each of the optical traps having a power less than about 1W;
focusing in three dimensions along a line near the nanowire the plurality of optical traps, which comprise more than two optical traps, collectively near one of the first nanowire forming an extended trapping potential along the line and thereby using the plurality of optical traps to trap the nanowire and move the nanowire in three dimensions without radiative damage to the nanowire and also maintaining orientation of the nanowire while subject to drag forces in the liquid; and
processing the first nanowire, thereby reducing radiative damage while exerting more force on the first nanowire compared to use of a single one of the optical traps to process the first nanowire.

19. The method as defined in claim 18 wherein the step of processing the at least first nanowire includes at least one of manipulating, isolating, heating and chemically transforming the at least first nanowire.

20. A method of processing a nanowire, comprising the steps of:
providing a fluid;
providing a first nanowire selected from the group consisting of a metal nanowire and a semiconductor nanowire;
placing the nanowire in the fluid;
providing a beam of light;
imprinting a hologram onto the beam of light to create a plurality of beams of light;
forming a plurality of optical traps from the plurality of beams of light;
focusing the plurality of optical traps, which comprise more than two optical traps, collectively near one of the at least first nanowire and forming an extended trapping potential in three dimensions along a line of the nanowire, thereby trapping the nanowire and maintaining orientation of the nanowire in three dimensions while subject to drag forces during the translating of the nanowire in the fluid; and
processing the first nanowire by using collectively all the plurality of optical traps spaced over the first nanowire, wherein the plurality of optical traps comprise more than two optical traps, thereby enabling application of more force on the first nanowire while reducing radiative damage overall to the first nanowire as compared to using a single optical trap to process the nanowire.

* * * * *